United States Patent [19]

Niki

[11] 4,310,891
[45] Jan. 12, 1982

[54] FREQUENCY MEASURING APPARATUS

[75] Inventor: Shoji Niki, Gyoda, Japan

[73] Assignee: Takeda Riken Kogyo Kabushiki Kaisha, Japan

[21] Appl. No.: 101,081

[22] Filed: Dec. 7, 1979

[30] Foreign Application Priority Data

Dec. 12, 1978 [JP] Japan ............................. 53/152694

[51] Int. Cl.³ .................... G06F 15/20; G01R 23/00
[52] U.S. Cl. .................................. 364/484; 455/147
[58] Field of Search ..................... 364/484; 455/147; 324/77 B, 85, 78 R, 78 D, 78 F

[56] References Cited

U.S. PATENT DOCUMENTS 3,909,599  9/1975  Trott, Jr. et al. ................. 364/484
4,093,988  6/1978  Scott ................................ 364/484
4,106,096  8/1978  Paoli ............................. 364/484 X Primary Examiner—Edward J. Wise
Attorney, Agent, or Firm—Staas & Halsey

[57] ABSTRACT

An input signal frequency and the output from a local oscillator are applied to a frequency converter to derive therefrom intermediate-frequency signals of frequencies corresponding to the differences between the input signal frequency and the output frequency of the local oscillator and between the former and harmonic frequencies of the latter. The intermediate-frequency signals are amplified by an amplifier, and the output freqeuncy of the amplifier and the oscillation frequency of the local oscillator are simultaneously measured twice. From intermediate frequencies $F_{i1}$ and $F_{i2}$ and the local oscillation frequencies $F_1$ and $F_2$ thus measured, the following calculation is made:

$$N = \text{Integer}\left(\frac{F_{i1} \sim F_{i2}}{F_{l1} \sim F_{l2}} + \alpha\right)$$

where $\alpha$ is zero or a decimal. At the same time, it is detected which one of the intermediate frequencies $F_{i1}$ and $F_{i2}$ is larger, and from the result of this determination, the above-mentioned N, the local oscillation frequency and the intermediate frequency corresponding thereto, the input signal frequency is calculated.

17 Claims, 7 Drawing Figures

FREQUENCY MEASURING APPARATUS

BACKGROUND OF THE INVENTION

This invention relates to a frequency measuring apparatus for measuring high frequencies, for example, above several hundred MHz, and more particularly to a frequency measuring apparatus in which an input signal, a local oscillation signal and its harmonic signals are frequency mixed by a frequency converter and the input signal frequency is measured utilizing intermediate-frequency signals derived from the frequency converter.

The frequency of an input signal can be measured by directly counting its waves per unit time. For input signal frequencies higher than microwaves, however, there is no counter capable of directly counting such high frequencies, or if there is any, it would be extremely expensive. A method that has heretofore been employed to obtain the input signal frequency is to convert the input signal into an intermediate-frequency signal and then measure its frequency. Further, in such a case, in order to obtain the intermediate-frequency signal over a wide frequency range, use is made of a frequency converter or the so-called harmonic mixer capable of obtaining not only the difference between the input signal frequency and a local oscillation frequency, but also the differences between the former and higher harmonics of the latter. The input signal frequency is measured from the number of waves of the resulting intermediate-frequency signal.

In this case, it is necessary to know whether the input signal is frequency mixed with the local oscillation signal itself or its harmonic and, in the case of the latter, its order. This involves troublesome operations and rapid measurement cannot be achieved. In view of this, there has been proposed such a frequency measuring apparatus as set forth, for example, in U.S. Pat. No. 3,932,814 (assigned to the assignee of the present application and patented Jan. 13, 1976), in which the input signal frequency is calculated on the basis of the difference in time between the moments at which the same intermediate-frequency signal is obtained, with the local oscillation frequency varied. In particular, the order of the higher harmonics of the local oscillation signal, with which the input signal is frequency mixed to obtain the intermediate-frequency signal, is detected from the above-mentioned time difference. In this case, a high degree of linearity is required between a control signal for controlling the frequency of a local oscillator and its output frequency, and in addition, it is necessary to vary the local oscillation frequency over a wide band. However, such a local oscillator is very expensive.

SUMMARY OF THE INVENTION

It is therefore one object of this invention to provide a frequency measuring apparatus which is capable of measuring high frequency input signals such as microwaves with relatively high accuracy and which can be constructed at low cost.

Another object of this invention is to provide a frequency measuring apparatus which is capable of measuring the frequency of microwaves over a wide frequency band, with the local oscillation frequency varied within a relatively narrow frequency band, and which does not require linearity between a local oscillator control signal and the local oscillation frequency and hence is inexpensive.

Another object of this invention is to provide a frequency measuring apparatus which is capable of correctly measuring an input signal frequency even if it varies over a relatively wide range.

In accordance with the present invention, the oscillation output from a frequency sweep local oscillator and an input signal are applied to a frequency converter to derive therefrom intermediate-frequency signals corresponding to the differences between the input signal frequency and the output frequency of the local oscillator and between the former and harmonic frequencies of the latter. The intermediate-frequency signals are amplified by an amplifier which amplifies signals over a relatively wide frequency band. The output frequency of the amplifier and the oscillation frequency of the local oscillator are measured by intermediate frequency measuring means and local oscillation frequency measuring means, respectively. These frequencies are simultaneously measured at least twice, at a proper interval of time, under the control of control means. Let $F_x$ represent the input signal frequency, $F_{l1}$ and $F_{l2}$ represent first and second measured values of the local oscillation frequency respectively, $F_{i1}$ and $F_{i2}$ represent first and second measured values of the intermediate frequency respectively, and n represent the order of a higher harmonic of the local oscillation frequency (in the case of n being 1, it indicates the local oscillation frequency itself). In the case where the input signal frequency $F_x$ is higher than the local oscillation frequency, the following relationship is established:

$$F_x - nF_{l1} = F_{i1}, \ F_x - nF_{l2} = F_{i2} \ n(F_{l2} - F_{l1}) = F_{i1} - F_{i2} \quad (1)$$

From this equation (1), that is, from $F_{l1}$, $F_{l2}$, $F_{i1}$ and $F_{i2}$ obtained by conducting the measurement twice, the harmonic order n can be obtained. Namely, the order of a higher harmonic of the local oscillation wave at which the intermediate frequency signal is provided can be obtained. Accordingly, the input signal frequency can be calculated from the harmonic order n, the local oscillation frequency and the intermediate frequency thus obtained.

Generally, the local oscillation frequency or its harmonic frequency may be higher than the input signal frequency in some cases, so that the local oscillation frequencies and the intermediate frequencies obtained by the measurement conducted twice bear the following relationship:

$$n(F_{l1} - F_{l2}) = (F_{i1} - F_{i2}) \quad (2)$$

Accordingly, $$n = (F_{i1} - F_{i2}/F_{l1} - F_{l2}) \quad (3)$$

From such relationship, the harmonic order n is calculated. Due to an error in the measurement and variations in the input signal frequency, n of the equation (3) does not always become an integer. Accordingly, a correct harmonic order N can be determined with the following equation:

$$N = \text{Integer } (n + \alpha) \quad (4)$$

where $\alpha$ is zero or a decimal. For example, if $\alpha = 0.5$, N can be determined by rounding n of the equation (3). By calculating the following equation based on the thus obtained integer value, that is, the correct harmonic order N:

$$NF_l \pm F_i = F_x \quad (5)$$

the input signal frequency $F_x$ is obtained. In this case, $F_l$ may be the above-mentioned measured value $F_{l1}$ or $F_{l2}$, or a local oscillation frequency measured separately of them. Similarly, $F_i$ may be $F_{i1}$ or $F_{i2}$, or the frequency of an intermediate-frequency signal measured separately. In either case, however, use is made of the local oscillation frequency and the intermediate frequency measured at the same time.

In general, the harmonic order N can also be determined by using an intermediate frequency and a local oscillation frequency measured in a short time. In particular, the accuracy of measurement of the intermediate frequency and the local oscillation frequency for obtaining the harmonic order N may be relatively low. In order to enhance the accuracy of calculation of the equation (5), however, the local oscillation frequency and the intermediate frequency are required to be highly accurate. Accordingly, it is better to measure the local oscillation frequency and the intermediate frequency separately from the measurement for obtaining the harmonic order N.

In the case of sweeping the local oscillation frequency downwardly, the local oscillation frequency $F_{l2}$ becomes smaller than $F_{l1}$ and the input signal frequency $F_x$ is constant, so that when the input signal frequency $F_x$ is higher than the mixed local oscillation frequency, the intermediate frequency $F_{i2}$ becomes higher than $F_{i1}$. In such a case, the equation (5) provides the sum. Where the input signal frequency $F_x$ is lower than the local oscillation frequency, the intermediate frequency $F_{i1}$ becomes higher than $F_{i2}$, so that in this case, the equation (5) provides the difference. In other words, it is decided whether the equation (5) takes the form of a sum or difference in dependence upon the relationship between the measured intermediate frequencies $F_{i1}$ and $F_{i2}$.

Therefore, as described previously, the intermediate frequencies $F_{i1}$ and $F_{i2}$ and the local oscillation frequencies $F_{l1}$ and $F_{l2}$ are measured, and the equations (3) and (4) are calculated using an arithmetic circuit. Furthermore, it is detected which one of the intermediate frequencies $F_{i1}$ and $F_{i2}$ is higher or lower than the other, and based on the detected result, the harmonic order N obtained from the equation (4), the local oscillation frequency $F_l$ and the intermediate frequency $F_i$ corresponding thereto, the input signal frequency $F_x$ is calculated using the equation (5).

The intermediate frequency and the local oscillation frequency can each be measured, for example, by opening a gate by control means for a certain period of time and counting the number of signal waves passing through the gate by means of a counter. Accordingly, the control means controls the two gates twice; in this case, when the intermediate-frequency signal is obtained by sweeping the local oscillation frequency, the control means responds to this to generate gate signals twice at a selected interval of time. The control means and the aforementioned arithmetic circuit can be formed by a so-called microcomputer. In this case, the gate signal may be derived from the microcomputer, but it is preferred to provide a gate signal generator which is controlled by the timing solely for the gate signal generation to produce gate signals of highly accurate time width.

In the case where the input signal frequency varies, for example, in the case where the input signal is a frequency-modulated signal, if the variation in the input signal frequency is larger than the difference between the first measured local oscillation frequency $F_{l1}$ and the second one $F_{l2}$, the harmonic order N cannot be determined. In such a case, the intermediate frequency and the local oscillation frequency are respectively measured at least three times, and the values of n are calculated at least twice using the equation (3). Then the mean value of n is substituted into the equation (4), and which the harmonic order N is determined. Alternatively, for each of the values of n obtained at least twice, the harmonic order N is obtained using the equation (4), and when the values of the harmonic order N thus obtained do not coincide with each other, the measurement is repeated again. In this way, highly accurate measurement can be achieved.

To determine the harmonic order, for example, twice, as described above, is achieved in the following manner. In the first determination of the harmonic order N, the local oscillation frequency and the intermediate frequency are simultaneously measured twice, with the local oscillation frequency being swept, for example, downwardly, and n and N are obtained by calculation. In the second determination of N, the local oscillation frequency and the intermediate frequency are simultaneously measured twice, with the local oscillation frequency swept upwardly, and n and N are similarly obtained by calculation. Then, the two values of the harmonic order N thus obtained are checked for coincidence therebetween, or the values of n are averaged to obtain N. Alternatively, simultaneous measurement of the local oscillation frequency and the intermediate frequency, without changing the direction of sweep of the local oscillation frequency, is effected at least three times, and n is calculated at least twice and averaged to obtain its mean value. Then N is calculated using the equation (4), or N is obtained using the equation (4) without averaging the values of n and then coincidence or non-coincidence of the values of N is detected. In this case, it is preferred that the measurement be conducted at different time intervals. That is, when the direction of change in the input signal frequency and that of the local oscillation frequency happen to be the same for each measurement, if an error exists in the determination of the harmonic order N, it is not cancelled. Accordingly, in the case of measuring the intermediate frequency and the local oscillation frequency a plurality of times, pseudo-random pulses are produced by control means to provide gate signals. Namely, upon each occurrence of the pseudo-random pulse, the intermediate frequency and the local oscillation frequency are measured.

In the counting of the number of waves by a counter, if a signal pulse to be supplied to the counter happens to occur at the rise or fall of the gate signal to be applied to the gate of a counter, the pulse is not counted in some cases. But, in the calculation of the input signal frequency $F_x$, $F_l$ is made N-fold, as indicated previously, so that even such one counter error in the measurement of $F_l$ would be increased N-fold in $F_x$. To avoid this, it is preferred to compare in phase the oscillation output from the local oscillator with a clock signal for producing the gate signal for measurement of the local oscillation frequency and control the local oscillator by the compared output for synchronizing the clock signal with the local oscillator. For such synchronization, the local oscillator is composed of a sweep voltage generator and a voltage controlled oscillator whose frequency is controlled by the output sweep voltage of the sweep voltage generator. The output from the voltage controlled oscillator and the clock signal for producing the gate signal are compared in phase, and the phase difference output is superimposed on the output from the sweep voltage generator, thereafter being supplied to the voltage controlled oscillator. With such an arrangement, when the control voltage is greatly varied by the sweep voltage, the oscillation frequency varies without being affected by the phase difference output. However, if the voltage sweep is stopped, the oscillation signal at that time becomes synchronized in phase with the clock signal.

The intermediate frequency may be measured not only by counting the waves of the intermediate-frequency signal but also by calculating the frequency based on the result of measuring of the period of the intermediate-frequency signal. In the case of employing a sweep voltage generator for changing the oscillation frequency of the local oscillator as mentioned previously, if the sweep voltage generator is designed to count, for example, clock pulses; convert the count value into an analog signal; and apply the converted output as a control signal to the voltage controlled oscillator, a value equal to the content of the counter for obtaining the aforesaid control voltage multiplied by a constant number can be utilized as the local oscillation frequency, thus avoiding the necessity of measuring it.

DESCRIPTION OF THE PREFERRED EMBODIMENTS

Figure 1:
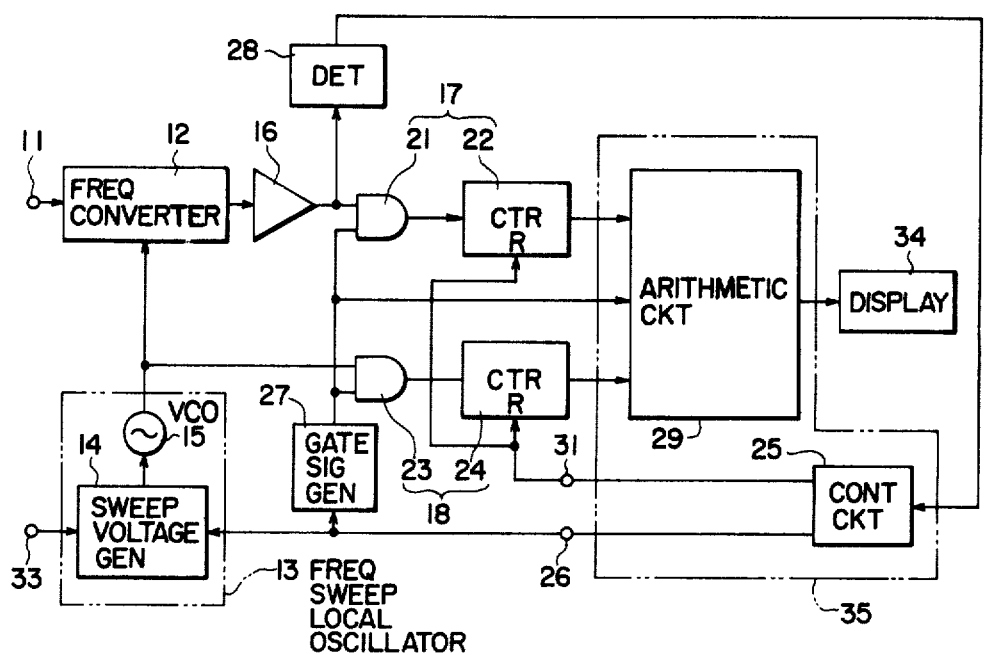
FIG. 1 is a block diagram showing an embodiment of the frequency measuring apparatus of this invention.

Referring first to FIG. 1, a description will be given of an embodiment of the frequency measuring apparatus of this invention. An input signal of a frequency $F_x$ is supplied to a frequency converter 12 from an input terminal 11 and a local oscillation wave of a frequency $F_l$ is also applied to the frequency converter 12 from a frequency sweep local oscillator 13. The frequency sweep local oscillator 13 comprises, for example, a sweep voltage generator 14 for generating a sweep voltage such as a sawtooth wave voltage and a voltage controlled oscillator 15 whose output frequency is controlled by the output sweep voltage from the sweep voltage generator 14.

From the frequency converter 12 are derived intermediate-frequency signals whose frequencies respectively correspond to the differences between the input signal frequency and the local oscillation frequency and between the input signal frequency and harmonic frequencies of the local oscillation wave. The output from the frequency converter 12 is amplified by an amplifier 16. The amplifier 16 has a relatively wide amplification band of, for example, 10 to 400 MHz. The frequency $T_i$ of the intermediate-frequency signal derived from the amplifier 16 and the local oscillation frequency $F_l$ of the local oscillator 13 are respectively measured by intermediate frequency measuring means 17 and local oscillation frequency measuring means 18. The intermediate frequency measuring means 17 comprises, for example, an intermediate-frequency gate 21 which is supplied with the output from the amplifier 16 and a counter 22 which counts the output from the gate 21. The local oscillation frequency measuring means 18 is composed of a local oscillation wave gate 23 which is supplied with the output from the local oscillator 13 and a local oscillation wave counter 24 which counts the output from the gate 23.

The intermediate frequency measuring means 17 and the local oscillation frequency measuring means 18 simultaneously perform measurement twice at certain time intervals. To perform this, for example, a control circuit 25 is provided, which derives at its terminal 26 a timing signal for determining the measurement timing. This timing signal is applied to a gate signal generator 27 to derive therefrom a gate signal of a constant width, by which the gates 21 and 23 are controlled to open and close. One part of the output from the amplifier 16 is branched to a detector 28, and when it is detected by the detector 28 that the intermediate-frequency signal is provided thereto from the amplifier 16, a detection signal is supplied to the control circuit 25. When supplied with the detection signal, the control circuit 25 derives the aforesaid timing signal at the terminal 26. With the fall of the gate signal from the gate signal generator 27, an arithmetic circuit 29 the contents of the counters 22 and 24, that is, the measured frequencies, and after this, the counters 22 and 24 are respectively reset by reset signals from an output terminal 31 of the control circuit 25.

When a start switch of the frequency measuring apparatus is turned ON to apply a start signal to the sweep voltage generator 14 from a terminal 33, the oscillation frequency $F_l$ of the local oscillation output from the local oscillator 13 linearly increases, for example, as shown in FIG. 2A. The input signal from the input terminal 11 is frequency mixed by the frequency converter 12 with the output from the local oscillator 13 and its harmonics, and the frequency $F_i$ of the intermediate-frequency output from the frequency converter 12 decreases with time, as depicted in FIG. 2B. Although the input signal frequency $F_x$ is constant, the frequency $NF_l$ of the harmonic of the local oscillation wave which is frequency-mixed with the input signal, gradually rises, so that the frequency $F_i$ decreases with time. When the frequency $F_i$ decreases to the amplification band of the amplifier 16, it is detected by the detector 28, so that the detector output assumes a high level from a moment $t_0$, as shown in FIG. 2C.

This detection signal is provided to the control circuit 25 to derive therefrom a timing signal of a width $T_1$ such as shown in FIG. 2E, which is supplied to the gate signal generator 27 and, at the same time, is supplied to the sweep voltage generator 14 of the local oscillator 13 to stop its sweep operation. The gate signal generator 27 yields a gate signal having a time width $T_2$ smaller than that $T_1$ at the moment $t_0$, as illustrated in FIG. 2F, thereby causing the gates 21 and 23 to open. As a consequence, the number of waves of the intermediate-frequency signal from the amplifier 16 is counted over the period $T_2$ to measure the frequency $F_{i1}$ of the intermediate-frequency signal and, at the same time, the number of waves of the local oscillation signal having passed through the gate 23 is counted to measure the oscillation frequency $F_{l1}$ at that time. These measured values are respectively taken and stored in the arithmetic circuit 29, for example, at the fall of the gate signal.

Figure 2:
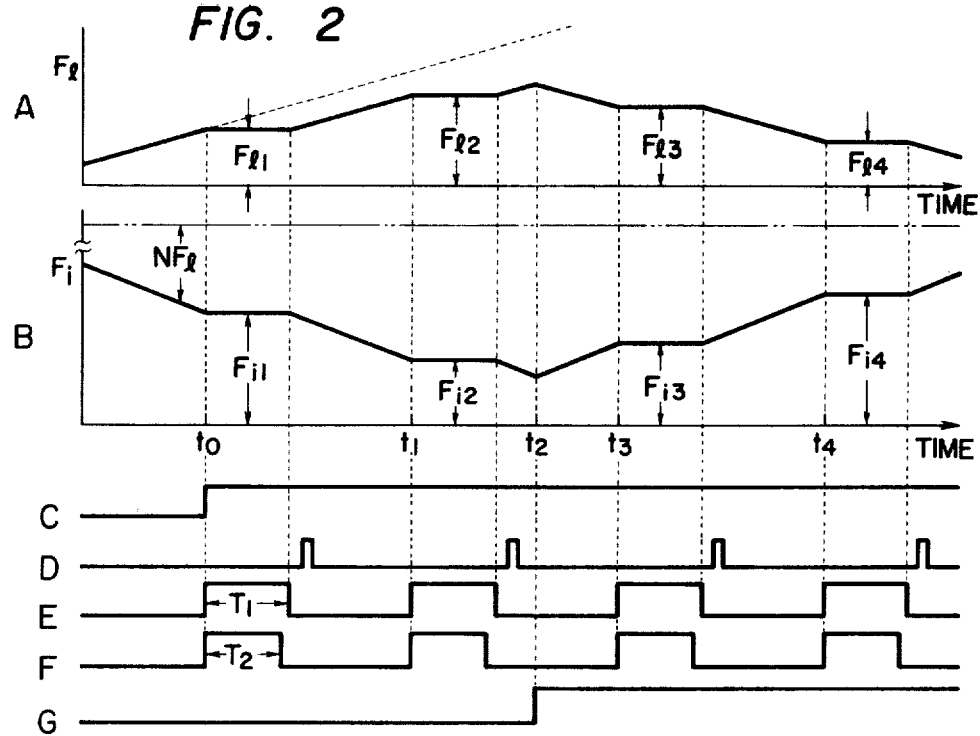
FIG. 2 is a timing chart explanatory of the operation of the apparatus shown in FIG. 1.

Then, upon termination of the duration $T_1$ of the timing signal derived at the terminal 26 of the control circuit 25, the local oscillator 13 starts a frequency sweep, resulting in the oscillation frequency increasing again and the intermediate frequency from the amplifier 16 decreasing, as shown in FIG. 2. Then, a reset signal is provided at the terminal 31 of the control circuit 25, as shown in FIG. 2D, resetting the counters 22 and 24. At a moment $t_1$ after the lapse of a suitable period of time, the control circuit 25 yields the timing signal again at the terminal 26, as depicted in FIG. 2E, so that the gate signal generator 27 produces a second gate signal, as shown in FIG. 2F, so that the frequency $F_{i2}$ of the intermediate-frequency signal and the oscillation frequency $F_{l2}$ of the local oscillator 13 are measured at that time. The measured values are read in by the arithmetic circuit 29 again.

In this manner, the local oscillation frequencies $F_{l1}$ and $F_{l2}$ and the intermediate frequencies $F_{i1}$ and $F_{i2}$ measured as described above are stored in the arithmetic circuit 29, and based on these measured values, the operations of the aforesaid equations (3) and (4) are carried out to determine the harmonic order N. Further, it is determined which one of the intermediate frequencies $F_{i1}$ and $F_{i2}$ is larger, and then, based on the harmonic order N, the magnitude relationship between the intermediate frequencies, the intermediate frequency $F_{i1}$ (or $F_{i2}$) and the local oscillation frequency $F_{l1}$ (or $F_{l2}$), the operation of equation (5) is performed by the arithmetic circuit 29. In the present embodiment, the sweep is effected so that the intermediate frequency $F_{i1}$ is larger than $F_{i2}$ and so that the local oscillation frequency rises. Therefore, in the converting operation of the frequency converter, a local oscillation frequency N times the fundamental local oscillation $F_l$ is subtracted from the input signal frequency to provide an intermediate-frequency signal. In other words, since the input signal frequency $F_x$ is higher than the higher harmonic frequency of the local oscillation wave used in the frequency conversion, the calculation of the input signal frequency $F_x$ by equation (5) is an addition calculation. The calculation result is displayed on a display device 34.

The arithmetic circuit 29 and the control circuit 25 can easily be formed as one unit by a so-called microcomputer. In such a case, the output from the detector 28 is periodically monitored by the microcomputer and when the detector 28 produces an output, the timing pulse shown in FIG. 2E is generated. The time intervals for generating the timing pulse are also controlled by the microcomputer to stop the sweep operation of the local oscillator 13 accordingly. At the same time, the gate signal is produced in the gate signal generator 27, for example, by counting accurate clock pulses. The intermediate frequency and the local oscillation frequency are measured by the counters 22 and 24, respectively, and the measurement may also be detected with the fall of the gate signal. However, since the timing signal shown in FIG. 2E is also produced by the microcomputer, completion of the counting by the counters 22 and 24 can be detected by the microcomputer itself, and consequently the contents of the counters 22 and 24 are stored in the microcomputer at a suitable time. It is easy to measure the respective frequencies twice at proper time intervals and programmatically perform the calculations of the equations (4) and (5) on the measured values.

Figure 3:
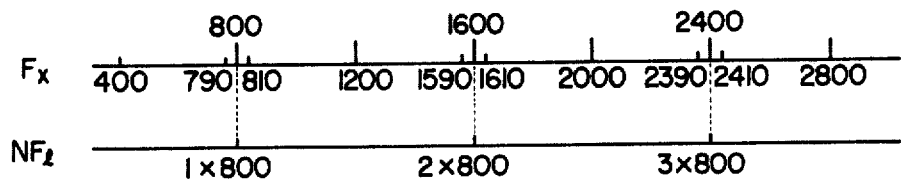
FIG. 3 is a diagram showing the relationships among an input signal, a local oscillation frequency and the order of a harmonic used in the converting operation.

Let it be assumed, for example, that the input signal frequency $F_x$ is above 400 MHz as shown in FIG. 3 and that the intermediate-frequency amplifier 16 has an amplification band ranging from 10 to 400 MHz. In this case, if the local oscillation frequency $F_l$ is selected to be 800 MHz, then it is possible to output from the amplifier 16, after frequency conversion, input signals of 400 to 790 MHz and 810 to 1200 MHz in connection with the fundamental wave; with respect to the second higher harmonic of 1600 MHz, input signals of 1200 to 1590 MHz and 1610 to 2000 MHz can be derived from the amplifier 16 after being frequency converted; and with respect to the third higher harmonic of 2400 MHz, input signals of 2000 to 2390 MHz and 2410 to 2800 MHz can be obtained from the amplifier 16 after being frequency converted. In order to achieve the above-mentioned two measurements in respect of the input portion falling outside the amplification band of the intermediate-frequency amplifier 16, it is possible to obtain an intermediate-frequency signal by sweeping the oscillation frequency of the local oscillator 13, for example, about 200 MHz. In this way, an input signal of a high frequency can be measured by measuring a local oscillation frequency of about 800 MHz and an intermediate frequency below about 400 MHz; thus, highly accurate measurement can be performed with an inexpensive arrangement. In addition, the higher harmonic order N which is needed for the measurement can easily be obtained by calculation, as described above.

Figure 4:
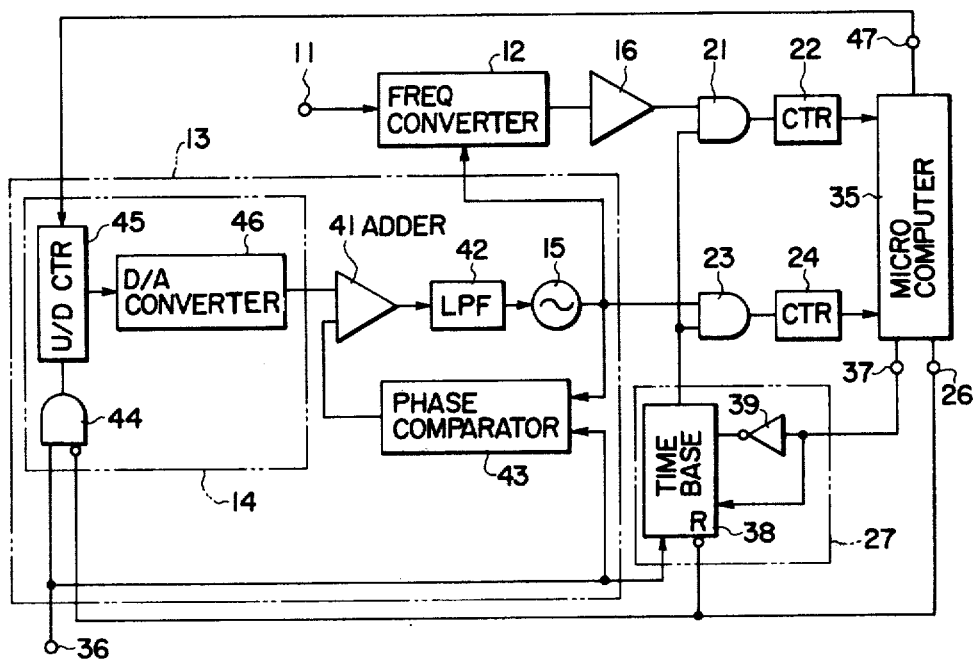
FIG. 4 is a block diagram illustrating another embodiment of this invention which includes various other modifications thereof.

From the viewpoint of rapid measurement of the input signal frequency, it is preferred that the intermediate frequency $F_i$ and the local oscillation frequency $F_l$ necessary for the equations (3) and (4) for the calculation of the higher harmonic order N be measured in a relatively short time. Nevertheless, since high accuracy is called for in the calculation of the equation (5) for obtaining the input signal frequency $F_x$, it is desirable that the intermediate frequency and the local oscillation frequency therefor be measured with high accuracy. In view of this, it is preferred that, in the case of measuring the intermediate frequency and the local oscillation frequency, a gate signal of relatively long duration, as compared with that used in the case of measuring the frequencies for calculating the higher harmonic order, be applied to the gates 21 and 23. To this end, it is possible to employ, as the gate signal generator 27, a semiconductor integrated circuit which is a so-called frequency divider for counting clock pulses from a terminal 36 and called a time base 38, as shown in FIG. 4 in which parts corresponding to those in FIG. 1 are identified by the same reference numerals. This semiconductor integrated circuit counts the clock pulses and selects any one of its plurality of terminals to generate a pulse of a time width corresponding to the selected terminal. Consequently, in the case of producing the gate signal for determining the harmonic order N, for instance, the output at a terminal 37 of the microcomputer 35 is raised to its high level and applied to one of the terminals of the time base 38 to yield the gate signal pulse of the time width $T_2$ shown in FIG. 2. In the case of generating the gate signal for frequency measurement use, that is, for measurement of the intermediate-frequency and the local oscillation frequency for calculating the input signal frequency, however, a low-level signal is provided at the terminal 37 of the microcomputer 35. This low-level signal is applied via an inverter 39 to another predetermined terminal of the time base 38 to derive therefrom a gate signal of a desired time width, that is, a time width larger than $T_2$. In order that the time base 38 may operate only when required, a signal from the terminal 26 is applied to a reset terminal of the time base 38 to actuate it only while the signal from the terminal 26 is high-level. In the other cases, the time base 38 is held in its reset state.

In the calculation of the input signal frequency $F_x$, the local oscillation frequency $F_l$ is made N-fold, so that if there is an error in the local oscillation frequency, it is also increased N-fold. Accordingly, it is desired that no error of even one bit be made. To this end, for example, in the local oscillator 13, the output from the sweep voltage generator 14 is supplied to an adder 41, whose output, in turn, is applied via a low-pass filter 42 to the voltage controlled oscillator 15. The output from the voltage controlled oscillator 15 is provided to a phase comparator 43, wherein it is compared in phase with the clock for determining the accuracy of the gate signal generator 27, that is, the clock from the terminal 36, and the resulting phase difference output is applied to the adder 41, wherein it is added to the sweep voltage of the sweep voltage generator 14. With such an arrangement, in the feedback control loop from the phase comparator 43 to the voltage controlled oscillator 15, when the voltage from the sweep voltage generator 14 is larger than a certain value, it falls outside of the phase control range of the feedback control loop and the frequency of the voltage controlled oscillator 15 is controlled by the sweep voltage. In the case where a change in the sweep voltage of the sweep voltage generator 14 is smaller than a predetermined value or where the sweep of the sweep voltage is stopped, the frequency of the voltage controlled oscillator 15 is controlled by the output from the phase comparator 43, so that the clock from the terminal 36 and the oscillation of the local oscillator 15 are synchronized in phase with each other. In particular, the oscillation phase of the local oscillator 13 is synchronized with the gate signal for controlling the gates 21 and 23. As a consequence, the counter 24 which measures the local oscillation frequency is capable of achieving accurate measurement without introducing any count error.

In FIG. 4, a counter is utilized as the sweep voltage generator 14, and the clock signal from the terminal 36 is supplied via an inhibit gate 44 to a counter 45 and the count value of the counter 45 is converted by a D-A converter 46 into an analog signal, providing sawtooth-wave sweep voltage. In order to stop the sweep voltage generator 14 from voltage sweep, the output at the terminal 26 is applied to the inhibit gate 44, and while the signal from the terminal 26 is high-level, the clock signal at the terminal 36 is not supplied to the counter 45 and the counter 45 holds its count value at that time. The frequency of the clock signal at the terminal 36 is selected to be, for example, about 1 MHz. The clock for generating the gate signal from the gate signal generator 27 and the clock to be to the counter 45 in the sweep voltage generator 14 may be different from each other. The sweep voltage generator 14 may be formed by a counter, as described above, or may also be arranged to integrate a constant DC voltage to provide a sweep voltage; furthermore, various other sweep voltage generators may be employed. By twice effecting a simultaneous measurement of the intermediate frequency and the local oscillation frequency, as described above, the harmonic order N can be determined. But, in the case of the input signal frequency $F_x$ varying, if this change is larger than a change in the local oscillation frequency $(F_{l1} \sim F_{l2})$ in the time interval between the first simultaneous measurement of the intermediate frequency and the local oscillation frequency and the second simultaneous measurement thereof, the correct harmonic order N cannot be determined. This problem can be solved, for example, in the following manner.

After the intermediate frequency and the local oscillation frequency are twice simultaneously measured over an interval of time, the direction of frequency sweep of the local oscillator 13 is reversed and then the intermediate frequency and local oscillation frequency are again twice simultaneously measured over an interval of time. Then n is calculated by equation (3) using the results of the two simultaneous measurements. The resulting two n's are averaged and the harmonic order N is calculated by the equation (4) using the average value. Alternatively, if the two N's obtained from the equation (4) in connection with the above-mentioned two n's do not coincide with each other, the measurements are carried out again. For reversal of the direction of sweep, for example, in FIG. 4, a control signal is provided from a terminal 47 of the microcomputer 35 and an up-down counter is employed as the counter 45 in the sweep voltage generator 14; when the control signal from the terminal 47 is low-level, the counter 45 is put in its up-count state, whereas in the case of the control signal being high-level, the counter 45 is put in its down-count state.

For example, as shown in FIG. 2G, in the frequency measurement at times $t_0$ and $t_1$, the local oscillation frequency is controlled to rise with time as described previously and the control signal from the terminal 47 is held low-level. But the control signal from the terminal 47 is raised to the high level at the time $t_2$ following the times $t_0$ and $t_1$ at which the intermediate frequency and the local oscillation frequency were simultaneously measured twice. By the control signal, the up-down counter 45 is put in its down-count state to subtract from its count content upon each occurrence of a clock pulse. Further, the microcomputer 35 produces timing signals at the terminal 26 at times $t_3$ and $t_4$, as depicted in FIG. 2E, and at this timing, gate signals are provided, as shown in FIG. 2F, resulting in the intermediate frequency and the local oscillation frequency being simultaneously measured twice in the same manner as in the foregoing. The harmonic order is calculated using the results of measurement. In the calculation of the harmonic order through utilization of the results of measurement in which the sweep frequency is increased, however, $(F_{l1} - F_{l2})/(F_{l2} - F_{l1})$ is calculated, and also in connection with the results of measurement carried out at the times $t_3$ and $t_4$ with the local oscillation frequency decreased, the calculation is achieved based on the above-mentioned equation. Both of the calculation results are averaged, including their polarity. As indicated by the equation (4), the average value thus obtained is added with $\alpha$ to determine the integer value, thus obtaining the harmonic order N. According to this method of determining the harmonic order N, when the input signal frequency changes in a constant direction, the direction of a change in the local oscillation frequency in the second calculation of n is opposite to that in the first calculation of n, so that an error in the second calculation is reverse in polarity from the error in the first calculation. Accordingly, the error can be reduced by averaging the n's obtained by the two calculations. The direction of sweep of the local oscillation frequency can be controlled to be reversed not only by reversing the direction of counting the clock pulses in the sweep voltage generator 14, as described above, but also by a method in which a sweep voltage is produced by an integration method and then the polarity of the input DC voltage is changed over.

Figure 6:
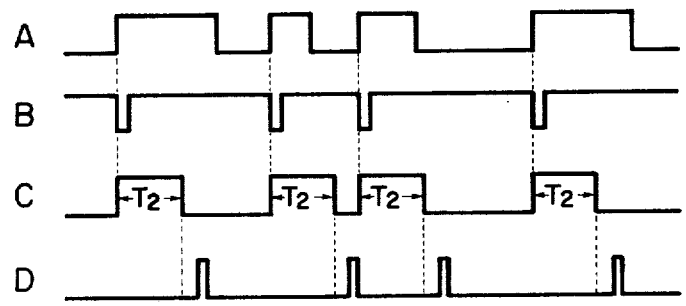
FIG. 6 is a timing chart explanatory of the operation of the arrangement of FIG. 5.
Figure 5:
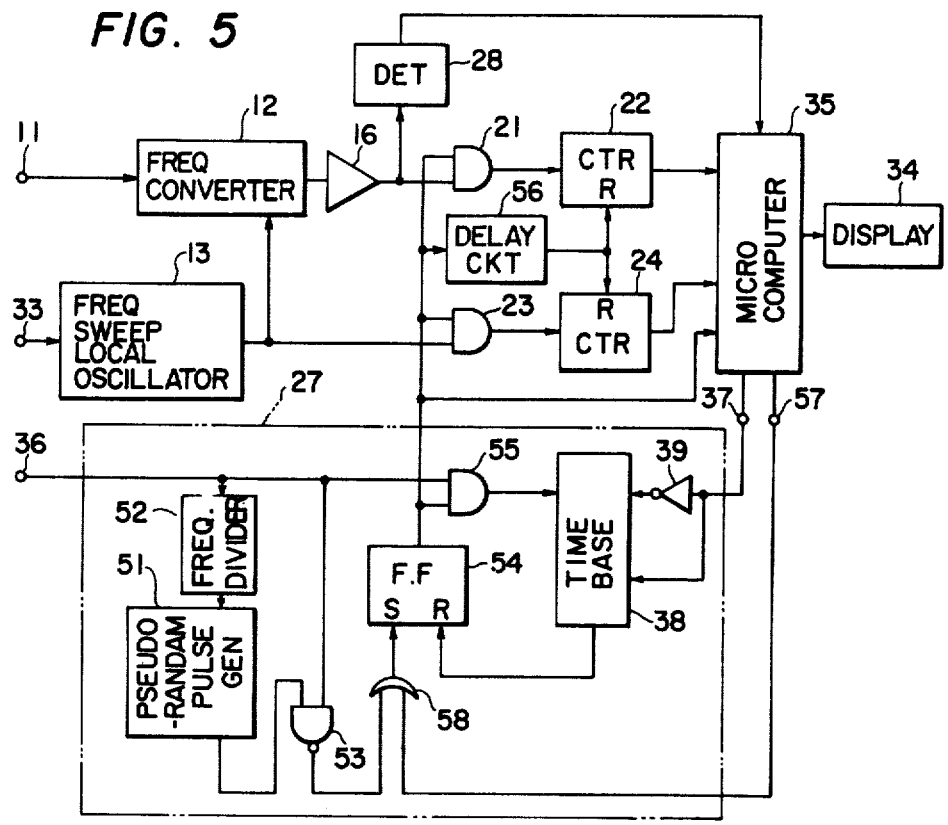
FIG. 5 is a block diagram showing, by way of example, an arrangement for averaging by measuring an intermediate frequency and a local oscillation frequency at least three times sweeping the local oscillation frequency in a constant direction.

As described above, the calculation of n (equation (3)) is performed a plurality of times and the calculated values are averaged and then the harmonic order N is obtained from the average value using equation (4). Alternatively, when the results of the calculation of equation (4) (effected a plurality of times for a plurality of n's) do not coincide, the measurement is conducted again. In this way, the harmonic order N can be obtained correctly. This is also applicable to the case of sweeping the local oscillation frequency in the same direction. In such a case, the frequency measurements are conducted at different time intervals; especially in the case of measuring a number of times, if the intervals of measurement are varied at random, more correct measurement is achieved since the input signal frequency does not vary at random. Further, in such a case, even if the input signal frequency varies greatly compared with the local oscillation frequency sweep range, correct measurement can be achieved. This will hereunder be described with reference to FIG. 5 in which parts corresponding to those in FIG. 1 are identified by the same reference numerals. It is the gate signal generator 27 that is characteristic of the illustrated arrangement, and the gate signals generator 27 is adapted to produce gate signals at random. To this end, for example, a pseudo-random pulse generator 51 is provided. For instance, a clock signal having a frequency of 1 MHz at the terminal 36 is frequency divided by a frequency divider 52 by 1/100 and is then applied to the pseudo-random pulse generator 51. Coincidence between the output from the pseudo-random pulse generator 51 and the clock signal from the terminal 36 is detected by a NAND gate 53. The output from the pseudo-random pulse generator 51 is produced, for example, as a signal such as that shown in FIG. 6A whose pulse width and pulse interval are random, and at the moment of rise of each pulse, negative pseudo-random timing signals are derived at the output of the NAND gate 53, as depicted in FIG. 6B. In order to obtain gate signals of a constant width at this timing, a flip-flop 54 is set by the output pulse from the NAND gate 53 and the output from the flip-flop 54 is supplied to a gate 55 and to the gates 21 and 23 for counting the intermediate frequency and the local oscillation frequency, respectively. The gate 55 is supplied with the clock signal from the terminal 36 and the output clock signal from the gate 55 is applied to the time base 38, and by the output therefrom, the flip-flop 54 is reset. As a consequence, upon each occurrence of the output pulse from the NAND gate 53, a gate signal of the constant width $T_2$ is yielded, as shown in FIG. 6C, and is provided to the gates 21 and 23.

Thus, the intermediate frequency and the local oscillation frequency are measured a plurality of times, and each gate signal is monitored at its trailing edge or the fall in the drawings, by the microcomputer 35 and, at the fall of the gate signal, the count contents of the counters 22 and 24, that is, the measured intermediate frequency and local oscillation frequency are respectively provided to the microcomputer 35. The gate signals are also applied to a delay circuit 56 to derive therefrom such a reset pulse train as shown in FIG. 6D in which each reset pulse is delayed behind the trailing edge of each gate signal for a certain period of time, and these reset pulses are fed to the counters 22 and 24 to reset them. For each group of two pairs of the intermediate frequency and the local oscillation frequency measured at two successive times, the calculation of $(F_{i1} - F_{i2}/F_{l2} - F_{l1})$ is conducted, the respective calculated values are averaged and then $\alpha$ is added to the averaged value to obtain the integer N. In this way, the harmonic order N is determined. Further, after or before such determination of the harmonic order, a pulse is provided from a terminal 57 of the microcomputer 35 via an OR gate 58 to the set terminal of the flip-flop 54 to set it, and at the same time, the output at the terminal 37 is dropped to the low level and the output from the inverter 39 is raised to the high level, by which the time of time base 38 is changed to sufficiently increase the time width of the gate signal. With the gate signal thus sufficiently enlarged, the intermediate frequency and the local oscillation frequency are measured, and based on these measured frequencies and the harmonic order determined by averaging as mentioned above, the input signal frequency $F_x$ is calculated.

Figure 7:
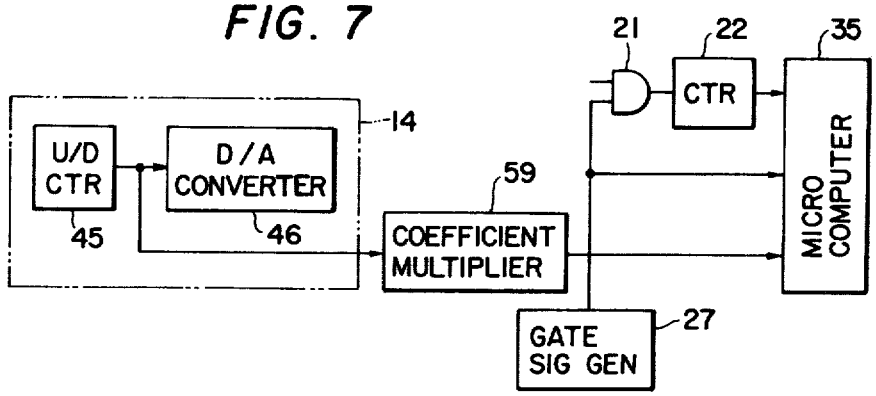
FIG. 7 is a block diagram illustrating the principal part of an example of measuring the local oscillation frequency using a signal from a sweep voltage generator.

In the above, the local oscillation frequency is measured by counting the local oscillation waves directly by the counter 24 but may also be measured, for example, by a signal available from the sweep voltage generator 14. For example, as shown in FIG. 7, in the sweep voltage generator 14 the content of the counter 45 is converted by a coefficient multiplier 59 into a signal corresponding to the local oscillation frequency and this signal is applied to the microcomputer 35 to load therein the content of the coefficient multiplier 59 at the same time as the intermediate frequency measured by the counter 22 is loaded in the microcomputer 35. The intermediate frequency may also be measured by measuring its period using an ordinary period measuring device and converting the period into the frequency. In the foregoing, for each measurement of the intermediate frequency or the local oscillation frequency for determining the harmonic order, sweep of the local oscillator is stopped; but the frequency may also be measured without stopping the sweep of local oscillator, and accordingly in the state that the frequency is varying. It is a matter of course, however, that this is limited specifically to the case where in the measuring time $T_2$, the intermediate frequency lies within the amplification range of the intermediate-frequency amplifier 16. Moreover, in such a state, when the local oscillation frequency varies linearly in response to a control voltage of the local oscillator, an average frequency in the measuring time $T_2$, that is, the frequency at the middle of the time $T_2$ is measured. Even when the local oscillation frequency varies non-linearly in response to the control voltage, if the measuring time $T_2$ is short and if the frequency variation or the non-linearity is sufficiently small, the measurement similarly be achieved without stopping the frequency sweep.

As has been described in the foregoing, in the frequency measuring apparatus of this invention, the harmonic order can be determined relatively easily and the local oscillator is sufficient to have a frequency variation range of, for example, about 200 MHz and hence need not be an expensive one. Since the frequency variation range may be small, there can be obtained an oscillation frequency of good linearity in response to the control voltage, thereby permitting highly accurate measurement. In particular, when the harmonic order is determined by averaging as described previously, the input signal frequency can be measured even if it fluctuates.

It will be apparent that many modifications and variations may be effected without departing from the scope of the novel concepts of this invention.

What is claimed is:

1. A frequency measuring apparatus comprising:
    means for providing an input signal;
    a frequency sweep local oscillator having an output;
    a frequency converter, operatively connected to said frequency sweep local oscillator, supplied with the output from said frequency sweep local oscillator and the input signal for producing, as an output, intermediate-frequency signals having frequencies corresponding to the differences between the input signal frequency and the frequency of the output of said frequency sweep local oscillator and between the input signal and the harmonic frequencies of the output of said frequency sweep local oscillator;
    an amplifier, operatively connected to said frequency converter, for amplifying the output from said frequency converter;
    intermediate frequency measuring means, operatively connected to said amplifier, for measuring the frequency of the output of said amplifier;
    local oscillation frequency measuring means, operatively connected to said frequency sweep local oscillator, for measuring the frequency of the output of said frequency sweep local oscillator;
    control means, operatively connected to said intermediate frequency measuring means and said local oscillation frequency measuring means, for controlling the intermediate-frequency measuring means and the local oscillation frequency measuring means to simultaneously measure the frequencies of the outputs of said amplifier and said frequency sweep local oscillator at least twice during a predetermined interval of time; and
    an arithmetic circuit, operatively connected to said intermediate frequency measuring means and said local oscillation frequency measuring means, for calculating the following equation:

$$N = \text{Integer}\left(\frac{F_{i1} - F_{i2}}{F_{l1} - F_{l2}} + \alpha\right)$$

where $F_{i1}$ and $F_{i2}$ are the frequencies measured at least twice by said intermediate frequency measuring means, where $F_{l1}$ and $F_{l2}$ are the frequencies measured at least twice by said local oscillation frequency measuring means, and where $\alpha$ is zero or a decimal, [N = Integer $(F_{i1} - F_{i2}/F_{l1} - F_{l2} + \alpha)\alpha$: zero or a decimal]
    said arithmetic circuit also for determining which of $F_{i1}$ and $F_{i2}$ is larger, and for calculating the frequency of the input signal in accordance with the determination, the frequency $F_l$ of the output of said frequency sweep local oscillator and the intermediate-frequency signal frequency $F_i$ corresponding thereto.

2. A frequency measuring apparatus as set forth in claim 1, wherein said control means comprises:
    a detector, operatively connected to said amplifier, for detecting generation of the intermediate-frequency signal from said amplifier and for generating a detection signal; and
    a control circuit, operatively connected to said detector, driven by the detection signal to generate first and second timing signals for the first and second measurements by each of the intermediate frequency measuring means and the local oscillation frequency measuring means.

3. A frequency measuring apparatus as set forth in claim 2, wherein said control circuit and said arithmetic circuit are formed by a microcomputer.

4. A frequency measuring apparatus as set forth in claim 3, wherein said control means generates a gate signal, wherein said intermediate frequency measuring means comprises an intermediate-frequency wave gate controlled by said gate signal from said control means to provide the output from said amplifier, and an intermediate-frequency wave counter for counting the output from said intermediate-frequency wave gate, and wherein said local oscillation frequency measuring means comprises a local oscillation wave gate controlled simultaneously with said intermediate-frequency wave gate by said gate signal to provide the output from said local oscillator, and a local oscillation wave counter for counting the output from said local oscillation wave gate.

5. A frequency measuring apparatus as set forth in claim 4, wherein said intermediate-frequency wave gate and said local oscillation wave gate are controlled directly by the output from the microcomputer.

6. A frequency measuring apparatus as set forth in claim 4, further comprising a gate signal generator, operatively connected to said microcomputer, driven by the output from said microcomputer to generate gate signals of a constant time width and to provide said gate signals to said intermediate-frequency wave gate and said local oscillation wave gate.

7. A frequency measuring apparatus as set forth in claim 1, wherein said local oscillator includes means for changing its oscillation frequency in dependence upon whether the oscillation frequency increases or decreases, wherein said control means reverses the direction of frequency sweep of said local oscillator after conducting the measurement twice, thereby causing said intermediate frequency measuring means and said local oscillation frequency measuring means to again simultaneously measure the frequencies of the outputs of said amplifier and said local oscillator twice during a predetermined interval of time, and wherein said arithmetic circuit calculates the equation and determines which one of the frequencies $F_{i1}$ and $F_{i2}$ is larger for each measurement, detects coincidence or non-coincidence between the resulting two values of the harmonic order N, and calculates the input signal frequency in the case of coincidence.

8. A frequency measuring apparatus as set forth in claim 7, wherein said control means generates a gate signal, wherein said intermediate frequency measuring means comprises an intermediate-frequency wave gate controlled by said gate signal from said control means to provide the output from said amplifier and an intermediate-frequency wave counter for counting the output from said intermediate-frequency wave gate, and wherein said local oscillation frequency measuring means comprises a local oscillation wave gate controlled simultaneously with said intermediate-frequency wave gate by said gate signal to provide the output from said local oscillator, and a local oscillation wave counter for counting the output from said local oscillation wave gate.

9. A frequency measuring apparatus as set forth in claim 1, wherein said local oscillator includes means for changing its oscillation frequency in accordance with whether the oscillation frequency increases or decreases, wherein said control means includes means for reversing the direction of frequency sweep of said local oscillator after conducting the measurement twice, thereby causing said intermediate frequency measuring means and said local oscillation frequency measuring means to again simultaneously measure the frequencies of the outputs of said amplifier and said local oscillator twice during a predetermined interval of time, and wherein the arithmetic circuit performs the calculation of $(F_{i1}-F_{i2})/(F_{l2}-F_{l1})$ for each measurement, obtains the harmonic order N by averaging the results of the calculations and calculates the input signal frequency from the harmonic order N, the local oscillation frequency $F_l$ and the intermediate frequency $F_i$ corresponding thereto.

10. A frequency measuring apparatus as set forth in claim 9, wherein said control means generates a gate signal, wherein said intermediate frequency measuring means comprises an intermediate-frequency wave gate controlled by said gate signal from said control means to provide the output from said amplifier, and an intermediate-frequency wave counter for counting the output from said intermediate-frequency wave gate, and wherein said local oscillation frequency measuring means comprises a local oscillation wave gate controlled simultaneously with said intermediate-frequency wave gate, by said control signal to provide the output from said local oscillator, and a local oscillation wave counter for counting the output from said local oscillation wave gate.

11. A frequency measuring apparatus as set forth in claim 1, 7, 8 or 9, wherein said local oscillator comprises a sweep voltage generator and a voltage controlled oscillator the output frequency of which is controlled by the output sweep voltage of said sweep voltage generator, and wherein said local oscillation frequency measuring means measures the local oscillation frequency from the output signal derived from the sweep voltage generator.

12. A frequency measuring apparatus as set forth in claim 1, wherein said control means causes said intermediate frequency measuring means and said local oscillation frequency measuring means to simultaneously conduct the measurement at least three times, and wherein said arithmetic circuit calculates $(F_{i1}-F_{i2})/(F_{l2}-F_{l1})$ for each of at least two different combinations of measured values, obtains a mean value n of the calculation results and calculates the input signal frequency from the value n, the harmonic order obtained using it, the local oscillation frequency $F_l$ and the intermediate frequency $F_i$ corresponding thereto.

13. A frequency measuring apparatus as set forth in claim 12, wherein said control means includes a random pulse generator and wherein said gate signal for controlling the measurement is generated in dependence upon the output generated by said random pulse generator.

14. A frequency measuring apparatus as set forth in claim 12, wherein said intermediate frequency measuring means comprises an intermediate-frequency wave gate for receiving the output from said amplifier, and an intermediate-frequency wave counter for counting the output from said intermediate-frequency wave gate, wherein said local oscillation frequency measuring means comprises a local oscillation wave gate, controlled simultaneously with said intermediate-frequency wave gate, for receiving the output from said oscillator, and a local oscillation wave counter for counting the output from said local oscillation wave gate, wherein said arithmetic circuit and said control means are formed by a microcomputer, and further comprising a pseudo-random pulse generator driven by said control means, a clock, and a gate signal generator for generating gate signals of a constant width in dependence upon the clock at timings of output pulses from said pseudo-random pulse generator, said gate signals being provided to said intermediate-frequency wave gate and said local oscillation wave gate.

15. A frequency measuring apparatus as set forth in claims 4, 13 or 14, which is adapted so that in order to obtain the local oscillation frequency $F_l$ and the intermediate frequency $F_i$ corresponding thereto for calculating the input signal frequency, there are generated from the control means gate signals of larger time width than the gate signals for measuring the frequencies $F_{l1}$, $F_{l2}$, $F_{i1}$ and $F_{i2}$ for the calculation of n.

16. A frequency measuring apparatus as set forth in claim 4, 12, 13 or 14, wherein said local oscillator comprises a sweep voltage generator and a voltage controlled oscillator the frequency of which is controlled by the output sweep voltage of said sweep voltage generator, said apparatus further comprising a phase comparator for comparing the phase of the output from said voltage controlled oscillator and the phase of a clock signal and an adder for superimposing the output from said phase comparator and the output sweep voltage of said sweep voltage generator and for providing, as an output, a control signal to said voltage controlled oscillator, said control means generating the gate signals in accordance with the clock signal.

17. A frequency measuring apparatus comprising:
means for providing an input signal;
a frequency sweep local oscillator having an output;
a frequency converter, operatively connected to said frequency sweep local oscillator, supplied with the output from said frequency sweep local oscillator and the input signal for producing, as an output, intermediate-frequency signals having frequencies corresponding to the differences between the input signal frequency and the frequency of the output of said frequency sweep local oscillator and between the input signal and the harmonic frequencies of the output of said frequency sweep local oscillator;

an amplifier, operatively connected to said frequency converter, for amplifying the output from said frequency converter;

period measuring means, operatively connected to said amplifier, for measuring the period of the output of said amplifier and for determining the output frequency of said amplifier in dependence upon the measured period;

local oscillation frequency measuring means, operatively connected to said frequency sweep oscillator, for measuring the frequency of the output of said frequency sweep local oscillator;

control means, operatively connected to said period measuring means and said local oscillation frequency measuring means, for controlling the period measuring means and the local oscillation frequency measuring means to simultaneously measure the frequencies of the outputs of said amplifier and said frequency sweep local oscillator at least twice during a predetermined interval of time; and an arithmetic circuit, operatively connected to said period measuring means and said local oscillation frequency measuring means, for calculating the following equation:

$$N = \text{Integer}\left(\frac{F_{i1} - F_{i2}}{F_{l1} - F_{l2}} + \alpha\right)$$

where $F_{i1}$ and $F_{i2}$ are the frequencies measured at least twice by said period measuring means, where $F_{l1}$ and $F_{l2}$ are the frequencies measured at least twice by said local oscillation frequency measuring means, and where $\alpha$ is zero or a decimal, said arithmethic circuit also for determining which of $F_{i1}$ and $F_{i2}$ is larger, and for calculating the frequency of the input signal in accordance with the determination, the frequency $F_l$ of the output of said frequency sweep local oscillator and the period signal frequency $F_i$ corresponding thereto.

* * * * *